(12) United States Patent
Liu

(10) Patent No.: US 11,704,471 B2
(45) Date of Patent: Jul. 18, 2023

(54) THREE-DIMENSIONAL MASK SIMULATIONS BASED ON FEATURE IMAGES

(71) Applicant: Synopsys, Inc., Mountain View, CA (US)

(72) Inventor: Peng Liu, Cupertino, CA (US)

(73) Assignee: Synopsys, Inc., Sunnyvale, CA (US)

( * ) Notice: Subject to any disclaimer, the term of this patent is extended or adjusted under 35 U.S.C. 154(b) by 44 days.

(21) Appl. No.: 17/463,075

(22) Filed: Aug. 31, 2021

(65) Prior Publication Data

US 2022/0082932 A1    Mar. 17, 2022

Related U.S. Application Data

(60) Provisional application No. 63/079,067, filed on Sep. 16, 2020.

(51) Int. Cl.
| | | |
|---|---|---|
| *G06F 30/30* | (2020.01) | |
| *G03F 7/20* | (2006.01) | |
| *G06F 30/398* | (2020.01) | |
| *G03F 1/70* | (2012.01) | |
| *G03F 7/00* | (2006.01) | |
| *G06F 30/3308* | (2020.01) | |

(52) U.S. Cl.
CPC ............. *G06F 30/398* (2020.01); *G03F 1/70* (2013.01); *G03F 7/705* (2013.01); *G06F 30/3308* (2020.01)

(58) Field of Classification Search
None
See application file for complete search history.

(56) References Cited

U.S. PATENT DOCUMENTS

| | | | | |
|---|---|---|---|---|
| 7,587,704 | B2* | 9/2009 | Ye | G03F 7/70441 |
| | | | | 716/51 |
| 7,703,069 | B1* | 4/2010 | Liu | G03F 7/70441 |
| | | | | 716/50 |
| 8,938,696 | B1* | 1/2015 | Torunoglu | G06F 30/39 |
| | | | | 716/53 |
| 2017/0147734 | A1* | 5/2017 | Rosenbluth | G06F 30/367 |

OTHER PUBLICATIONS

Liu, P. "Accurate Prediction of 3D Mask Topography Induced Best Focus Variation in Full-Chip Photolithography Applications." Proceedings of SPIE, Photomask Technology, vol. 8166, Oct. 13, 2011, pp. 1-8.

(Continued)

*Primary Examiner* — Leigh M Garbowski
(74) *Attorney, Agent, or Firm* — Fenwick & West LLP

(57) ABSTRACT

A layout geometry of a lithographic mask is received. The layout geometry is partitioned into feature images, for example as selected from a library. The library contains predefined feature images and their corresponding precalculated mask 3D (M3D) filters. The M3D filter for a feature image represents the electromagnetic scattering effect of that feature image for a given source illumination. The mask function contribution from each of the feature images is calculated by convolving the feature image with its corresponding M3D filter. The mask function contributions are combined to determine a mask function for the lithographic mask illuminated by the source illumination.

19 Claims, 10 Drawing Sheets

(56) References Cited

OTHER PUBLICATIONS

Liu, P. et al. "Fast 3D Thick Mask Model for Full-Chip EUVL Simulations." Proceedings of SPIE, Extreme Ultraviolet (EUV) Lithography IV, vol. 8679, Apr. 1, 2013, pp. 1-16.
Liu, P. et al. "Fast and Accurate 3D Mask Model for Full-Chip OPC and Verification." Proceedings of SPIE, vol. 6520, Mar. 26, 2007, pp. 1-12.
PCT International Search Report and Written Opinion, PCT Application No. PCT/US2021/048761, dated Dec. 22, 2021, 11 pages.
Zhang, H. et al. "An Accurate ILT-Enabling Full-Chip Mask 3D Model for All-Angle Patterns." SPIE Photomask Technology, vol. 8880, Sep. 9, 2013, pp. 1-10.

\* cited by examiner

THREE-DIMENSIONAL MASK SIMULATIONS BASED ON FEATURE IMAGES

RELATED APPLICATION

This application claims priority under 35 U.S.C. § 119(e) to U.S. Provisional Patent Application Ser. No. 63/079,067, "Three-Dimensional Mask Simulations Based on Feature Images," filed Sep. 16, 2020. The subject matter of all of the foregoing is incorporated herein by reference in its entirety.

TECHNICAL FIELD

The present disclosure relates to three-dimensional mask simulations, including for full-chip or large-scale computational lithography applications.

BACKGROUND

One step in the manufacture of semiconductor wafers involves lithography. In a typical lithography process, a source produces light that is collected and directed by collection/illumination optics to illuminate a lithographic mask. Projection optics relay the pattern produced by the illuminated mask onto a wafer, exposing resist on the wafer according to the illumination pattern. The patterned resist is then used in a process to fabricate structures on the wafer.

Various technologies are directed to improving the lithography process, including the design of the lithographic mask. In computational lithography, the lithographic mask design is used as an input to a three-dimensional mask model, which is used to compute a mask function that describes the electromagnetic field scattering characteristics of the mask illuminated by the light source. The mask function may then be used as input to an optical imaging model (e.g., Abbe imaging model or Hopkins imaging model) to predict the printed pattern in resist. It is important that the three-dimensional mask model is accurate as well as fast.

SUMMARY

In one aspect, a layout geometry of a lithographic mask is received. The layout geometry is partitioned into a plurality of feature images, for example as selected from a library. The library contains predefined feature images and their corresponding precalculated mask 3D (M3D) filters. The M3D filter for a feature image represents the electromagnetic scattering effect of that feature image for a given source illumination. The mask function contribution from each of the feature images is calculated by convolving the feature image with its corresponding M3D filter. The mask function contributions are combined to determine a mask function for the mask illuminated by the source illumination.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to three-dimensional mask simulations based on feature images. The illumination pattern that exposes resist on a wafer depends on the geometric layout of the lithographic mask and the source illumination, among other factors. Simulation of the lithographic process depends on an accurate prediction of the electromagnetic field produced by the source illumination incident on the lithographic mask. This field may be predicted using rigorous, three-dimensional simulations of Maxwell's equations, accounting for diffraction and scattering effects. However, such simulations are computationally intensive and have long run times. As a result, in many cases, it is prohibitive to run rigorous three-dimensional simulations for the mask area covering an entire chip.

Aspects of the present disclosure relate to calculating the electromagnetic field diffraction and scattering characteristics, as represented by a mask function (MF), by using a set of feature images (a.k.a. feature vectors) and corresponding filters (referred to as mask 3D or M3D filters). The feature images represent basic geometries that may be present in the mask, and the corresponding M3D filters represent the scattering effects resulting from the feature images. The M3D filters may be determined based on rigorous electromagnetic simulation of the scattering effects of the feature images given the source illumination.

In one approach, the features images are selected from a library of predefined feature images and their corresponding precalculated mask 3D (M3D) filters. The feature images in the library include, but are not limited to, the following:

0-edge feature images: bulk area (no edges)
 1-edge feature images: edges of different orientations
 2-edge feature images: combinations of two edges with different orientations and spatial relations relative to each other
 3+ edge feature images: combinations of three or more edges (e.g., polygon shapes)

Advantages of the present disclosure include, but are not limited to, the following. It may be more suitable for use with both machine learning (ML) and non-ML frameworks as well as for graphics processing units (GPU). Compared to the full rigorous simulation, the approach is more computationally efficient for model creation, training and calibration and runtime is also reduced, while still producing accurate results for the mask function. The resulting mask function may also be used efficiently in both Hopkins and Abbe imaging models, which may be the next steps in the lithography simulation.

Figure 1A:
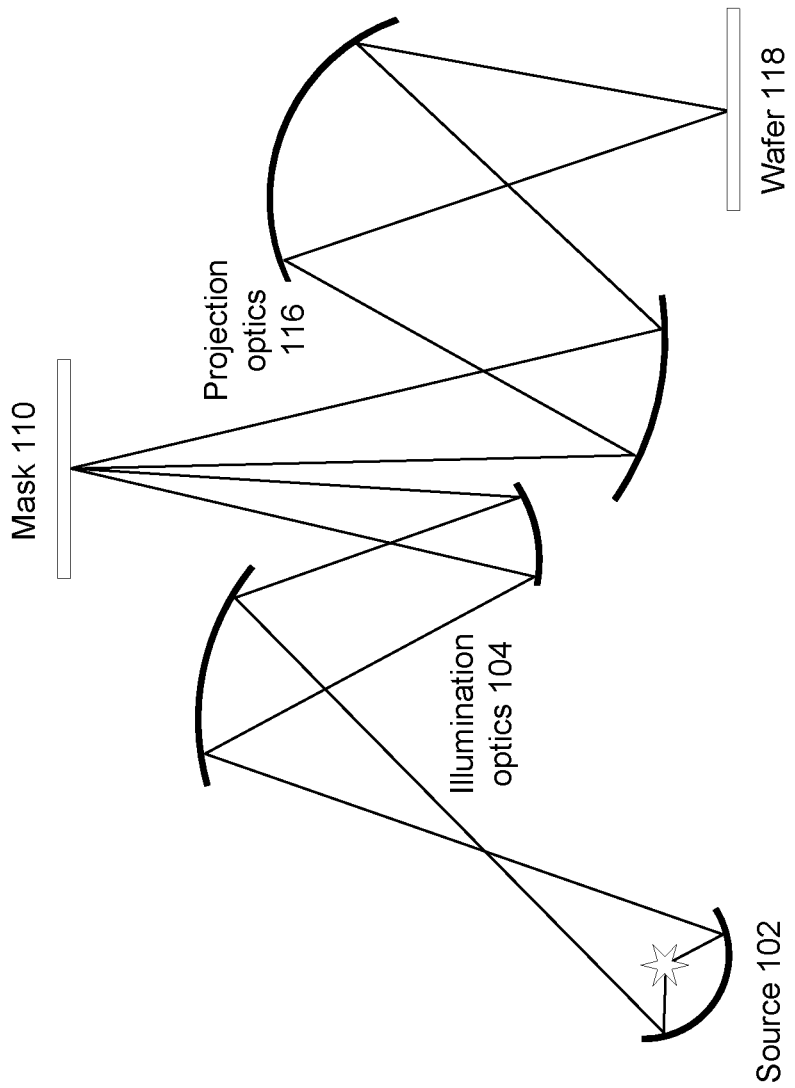
FIG. 1A depicts an extreme ultraviolet (EUV) lithography process suitable for use with embodiments of the present disclosure.

In more detail, FIG. 1A depicts an EUV lithography process suitable for use with embodiments of the present disclosure. In this system, a source 102 produces EUV light that is collected and directed by collection/illumination optics 104 to illuminate a mask 110. Projection optics 116 relay the pattern produced by the illuminated mask onto a wafer 118, exposing resist on the wafer according to the illumination pattern. The exposed resist is then developed, producing patterned resist on the wafer. This is used to fabricate structures on the wafer, for example through deposition, doping, etching or other processes.

In FIG. 1A, the light is in the EUV wavelength range, around 13.5 nm or in the range 13.3-13.7 nm. At these wavelengths, the components typically are reflective, rather than transmissive. The mask 110 is a reflective mask and the optics 104, 116 are also reflective and off-axis. This is just an example. Other types of lithography systems may also be used, including at other wavelengths including deep ultra-violet (DUV), using transmissive masks and/or optics, and using positive or negative resist.

Figure 1B:
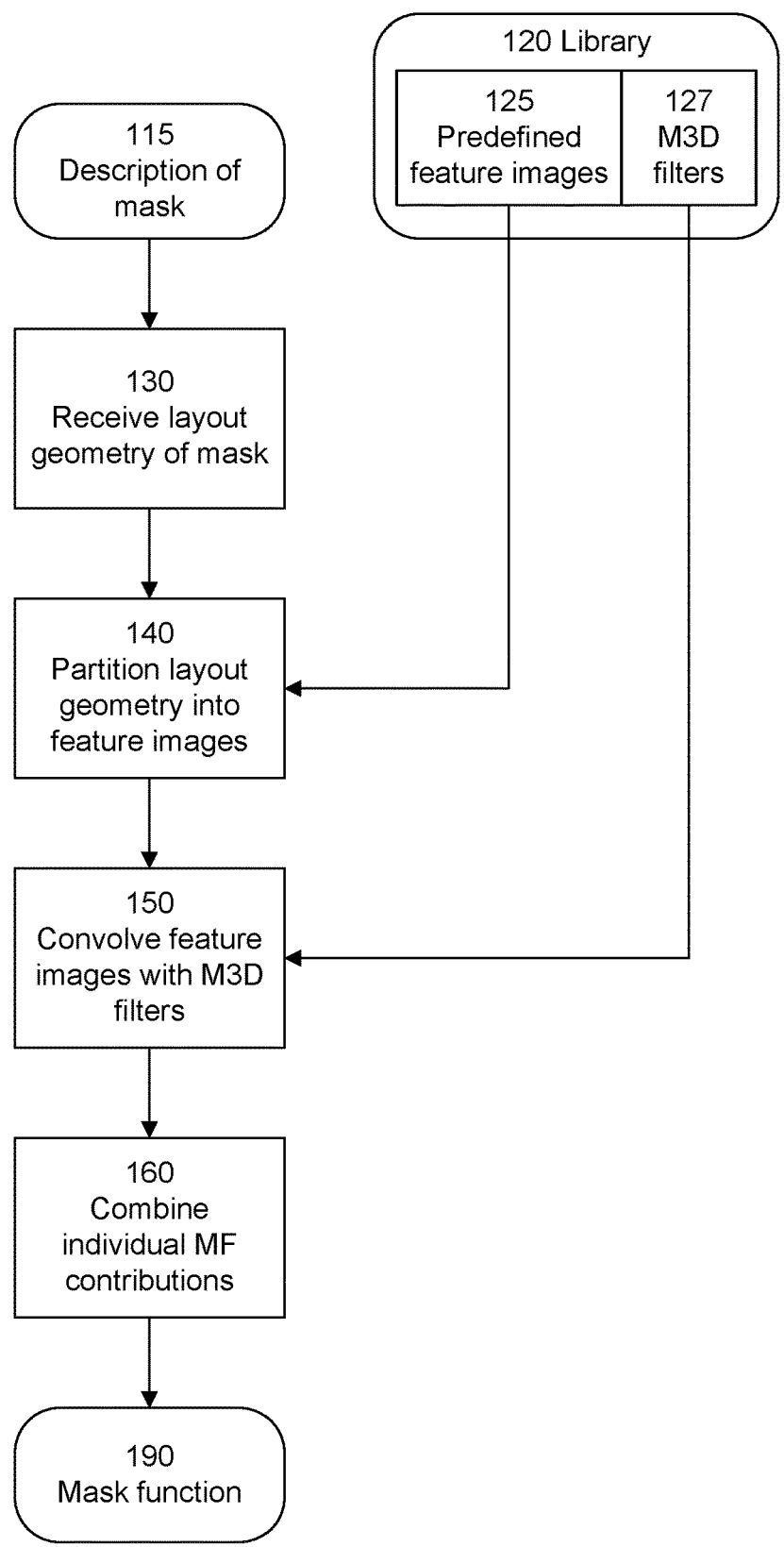
FIG. 1B is a flowchart for calculating scattering from a mask.

FIG. 1B is a flowchart for calculating scattering from a mask 110. The diffraction and scattering from the mask 110 is represented by a mask function (MF) 190. The process of FIG. 1B uses a description 115 of the mask and a library 120 to calculate the mask function 190 for the mask. The library contains predefined features images 125 and corresponding filters 127, which will be referred to as mask 3D (M3D) filters because they represent the contribution to the overall mask function from that type of feature image for a given source illumination. The M3D filters 127 include effects of the source illumination.

As shown in FIG. 1B, the layout geometry of the mask is received 130 and partitioned 140 into feature images. The mask function (MF) contribution from each feature image is calculated by convolving 150 the feature image 125 with its corresponding M3D filter 127. The aggregate mask function for the mask and given source illumination is determined by combining (e.g., summing) 160 the MF contributions from the individual feature images.

Figure 2:
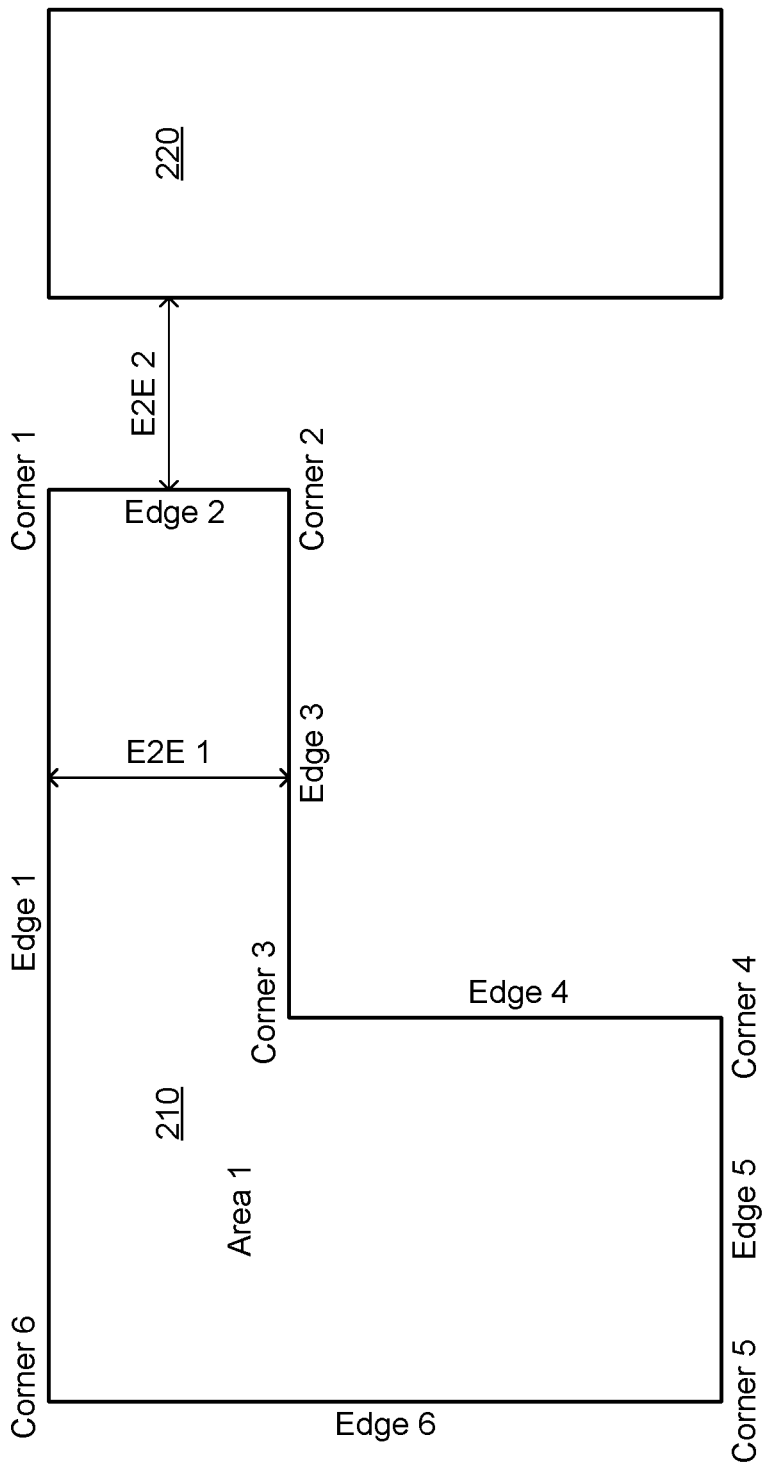
FIG. 2 depicts partitioning a mask layout geometry into feature images.

FIG. 2 depicts partitioning a mask layout geometry into feature images. FIG. 2 shows two shapes 210 and 220 from the layout geometry and the partitioning of shape 210 into features images. Shape 210 is partitioned into the following features images: one Area image, six Edge images, six Corner images, and two Edge-to-Edge (E2E) images. The shape 210 may be partitioned into the feature images based on rules to identify different features present in the mask layout. In this example, the interior area of the polygon shape 210 and its contribution to the mask function is represented by the Area 1 feature image. This defines which areas of the mask are opaque versus transmissive or reflective. The Edge feature images (Edge 1-Edge 6) account for diffraction and scattering of the electromagnetic wave at edges.

The remaining feature images are based on combinations of two edges, where there will be interaction between the two edges. The Corner feature images (Corner 1-Corner 6) account for interactions at corners, which is beyond just the individual contributions of the two edges. Note that in FIG. 2, the Corners include both inside corners and outside corners. The Edge-to-Edge (E2E) feature images account for interactions between parallel edges. E2E 1 accounts for interactions between Edges 1 and 3. E2E 2 accounts for interactions between Edge 2 and the left edge of shape 220.

Each of the feature images is an image. For example, the Area image may be the polygon of shape 210. Each of the Edge images may be a filtered version of the relevant edge. In some cases, rasterization filters are applied to generate the feature images.

The partitioning of the layout geometry uses predefined feature images 125 from library 120. The feature images in the library may be selected based on an understanding of scattering, and what types of geometric features contribute to scattering.

Figure 3:
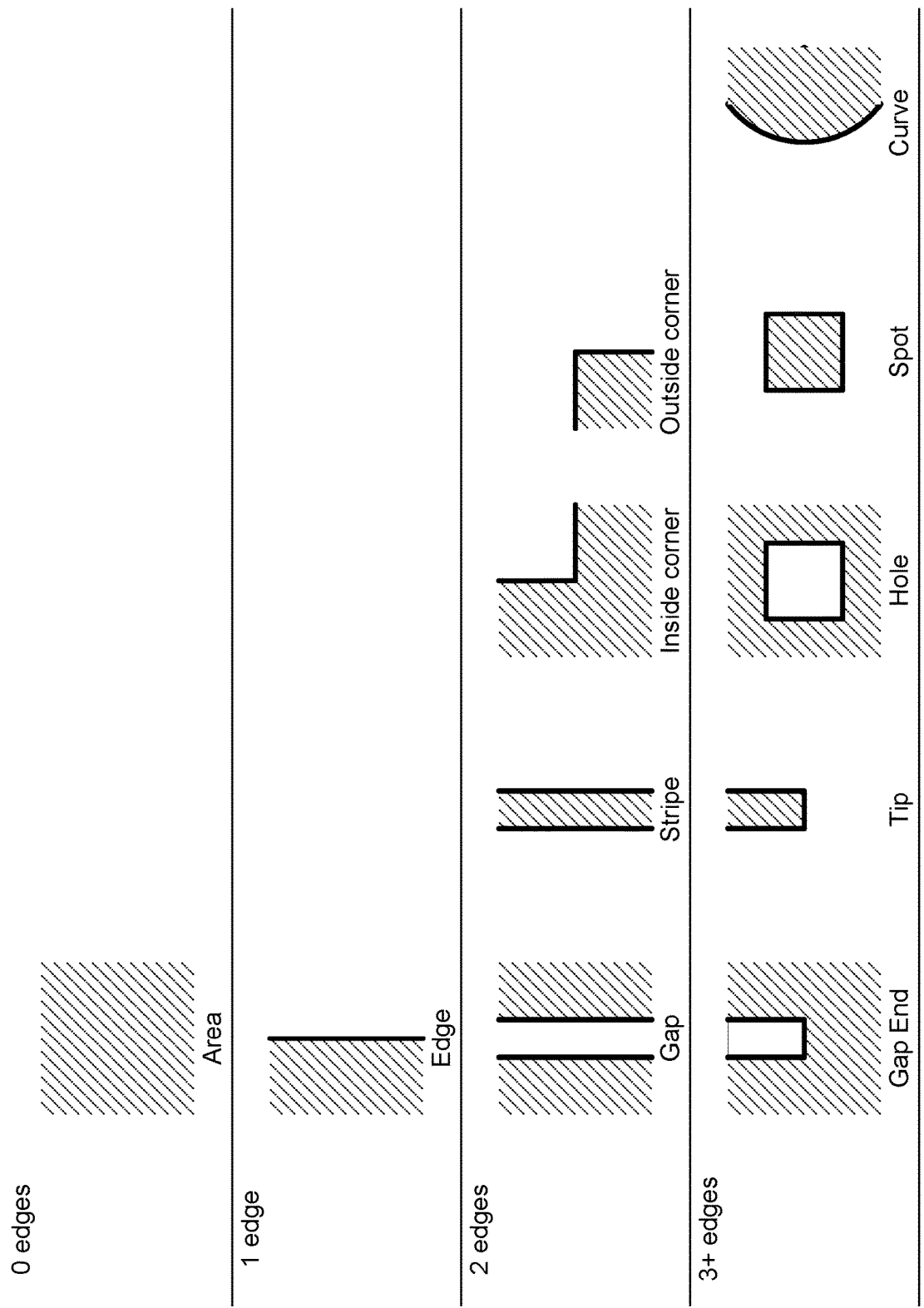
FIG. 3 depicts feature images in a library.

FIG. 3 depicts some examples of feature images in a library. The features images in FIG. 3 are classified according to the number of edges in the feature image. The feature images in the top row have 0 edges, the ones in the next row have 1 edge, and then 2 edges, and then 3+ edges. These are just examples and are not exhaustive.

In the top row, the Area feature image determines which areas of the mask are opaque versus transmissive or reflective. Actual instances of the Area feature images may have different shapes, sizes and locations, depending on the geometric layout of shapes on the mask. The M3D filter corresponding to the Area feature image represents the scattering produced by each point in the area assuming an infinitely large area, i.e., the contribution to the mask function from each point within a bulk area of the geometric layout ignore any edge effects. Hence, the convolution of the M3D filter with an instance of the Area feature image (e.g., Area 1 in FIG. 2) yields the MF contribution from the bulk area of that shape in the mask.

In the second row, the Edge feature image is another important class of feature images, because diffraction or scattering of the electromagnetic wave occurs at edges. FIG. 3 shows one Edge feature image, but the library may have many types of Edge images. For a mask with only Manhattan geometry, four Edge feature images are included in the library, corresponding to the four possible orientations of an edge in the Manhattan geometry. Some masks may also allow edges at multiples of 45 degrees, or even at arbitrary angles. The M3D filter corresponding to the Edge feature image represents the scattering produced by each point along the edge assuming an infinitely long edge.

The third row shows another important class of feature images, which are combinations of two edges. When two edges become close enough, there will be interaction between the two edges. Several examples are shown in FIG. 3. In the first two examples, the two edges are parallel. This is generally referred to as Edge-to-Edge (labeled E2E in FIG. 2). FIG. 3 shows two different polarities, depending on whether the area between the two edges is filled by mask material or not. In addition to the two different polarities, the library may also contain edge-to-edge feature images with different separations between the edges, and with the edges oriented at different angles (horizontal, vertical, at multiples of 45 degrees, etc.).

In the last two examples of third row, the two edges are perpendicular to each other. These are Corner feature images: an inside corner and an outside corner, depending on the polarity. The library may contain Corners oriented at different angles. Other two-edge feature images are also possible. For example, the two edges may be at different angles to each other. The two edges may be separated but not parallel to each other. Thus, the two edges will be slowly converging or diverging. Corners at angles other than 90 degrees are also possible.

The bottom row shows feature images with three or more edges. The first two examples are tips of both polarities. The library may contain versions of different widths and at different angular orientations. The next two examples are holes or vias of both polarities. Different versions may have different widths, heights and angular orientations. The final example shows a curved edge.

Each of the feature images has a corresponding filter that is used to produce the MF contribution from the feature image. That is, the scattering effects of the feature image are captured by the M3D filter. In one approach, rigorous simulations are performed for the feature images and the rigorous results are used to determine the M3D filters.

The M3D filters may be calculated by starting with lower order effects. The effect of an Area image (0-order feature image) depends only on the transmission or reflection of the area in question. In a rigorous simulation, the mask structure for this feature image is a plane of constant value. The M3D filter is a constant equal to the transmission or reflection computed from the rigorous simulation.

Next consider an Edge feature image. An edge in the layout geometry is partitioned into an Area feature image plus an Edge feature image. The rigorous simulation of edge scattering is then modeled by the MF contribution from the Area feature image plus the MF contribution from the Edge feature image. The MF contribution from the Area feature image is already determined, so the mask function contribution from the Edge feature image and the corresponding M3D filter may then be determined.

Figure 4A:
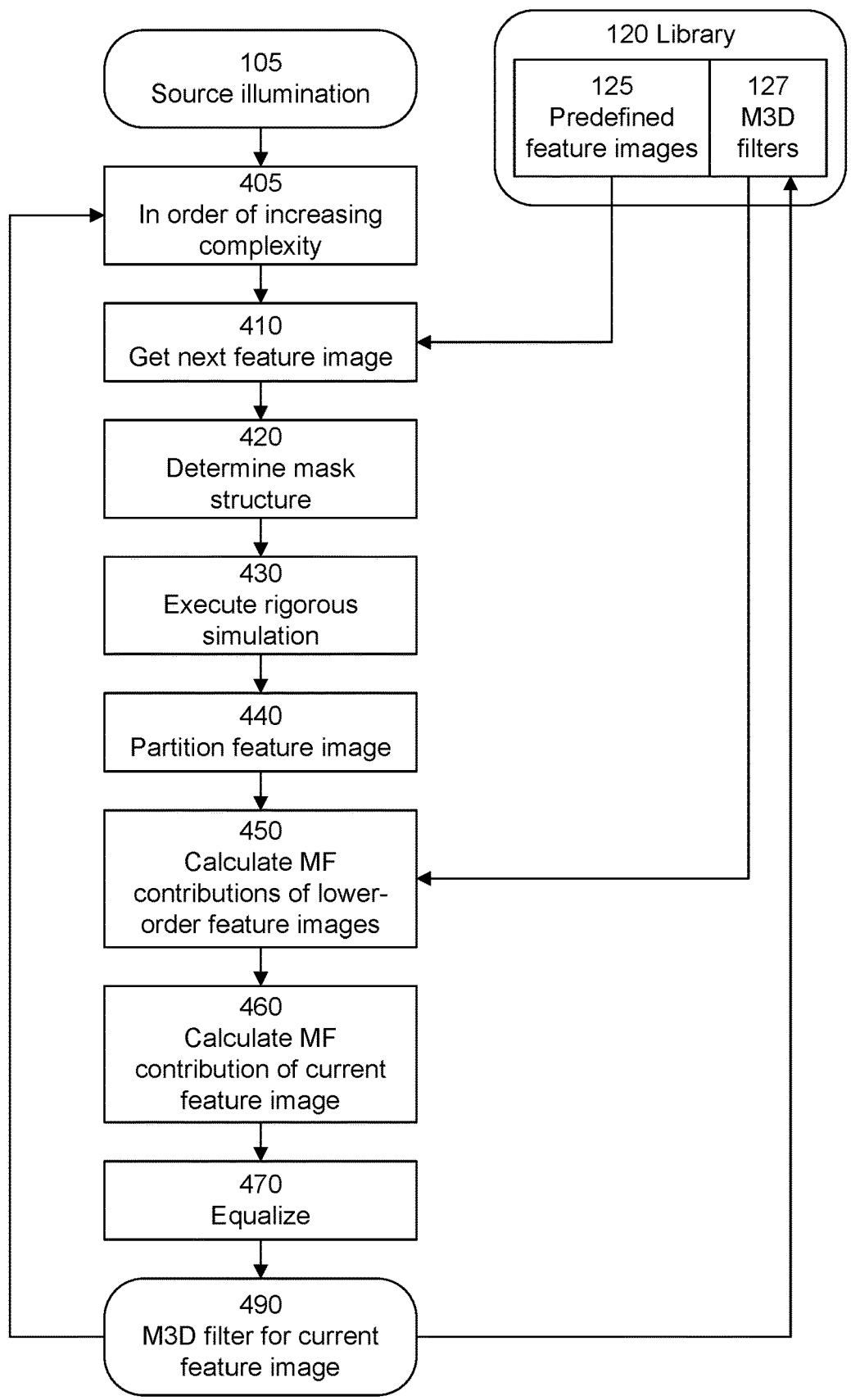
FIG. 4A is a flowchart for calculating a M3D filter for a feature image.
Figure 4B:
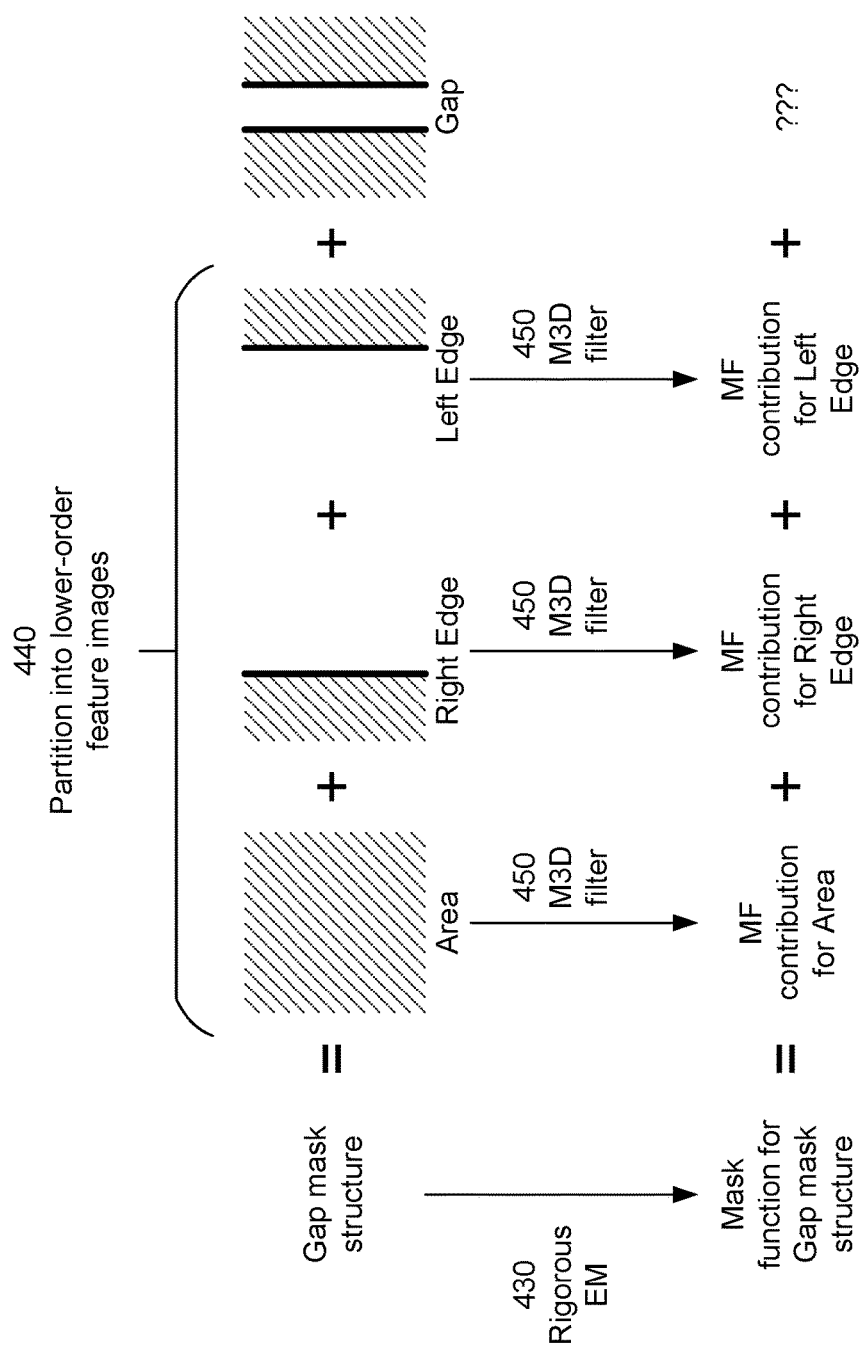
FIG. 4B depicts an example M3D filter calculation.

After all single-edge feature images are considered, then consider feature images that consist of two edges. FIG. 4A is a flowchart for calculating M3D filters for feature images, progressing from lower-order to higher-order feature images. FIG. 4B depicts an example M3D filter calculation for the two-edge Gap feature image shown in FIG. 3.

In the example of FIG. 4B, the M3D filters for 0-edge and 1-edge feature images have already been calculated and the process moves 405 to more complex feature images: two-edge feature images. The Gap feature image have a specific spacing $\Delta$ is considered next 410. The mask structure for the Gap feature image is determined 420 to be two edges separated by a spacing $\Delta$. Rigorous three-dimensional simulation may be executed 430 for this mask structure, yielding the mask function for this mask structure.

The geometric layout for this mask structure is also partitioned 440 into lower-order feature images: an Area feature image+two Edge features images+the Gap feature image of interest. This is shown pictorially in the top row of FIG. 4B. The aggregate mask function calculated by rigorous electromagnetic simulation equals the sum of the MF contributions from each feature image:

$$MF = \Sum_{i=1}^{N} I_i \otimes K_i \qquad (1)$$

where $I_i$ are the feature images, $K_i$ are the corresponding M3D filters, $\otimes$ is the convolution operator, and N is the number of feature images. MF is the mask function, which in this case is known from the rigorous simulation. The MF contributions for the lower-order feature images may be calculated 450 using the previously calculated M3D filters for those images. This leaves one unknown in Eqn. 1, shown pictorially at the bottom of FIG. 4B. That is the M3D filter for the Gap feature image, which may then be calculated 460. In some cases, this may be used as the M3D filter 127 in the library 120.

The feature images may be grayscale representations of features, which allow sparse sampling of the images. For example, an edge has infinite frequency components and would require infinite bandwidth to represent with 100% fidelity. However, it may instead be represented by a low-pass filtered version of the edge, which is like a grayscale blurry edge. Polygon shapes in the mask may be rasterized using a low-pass rasterization function. This removes high frequency components of the feature, retaining only the low frequency components. This is acceptable because the projection optics is actually a low pass system, so it will naturally filter out the high (spatial) frequency components. To make it more compact and therefore faster in rasterization operations, the low-pass rasterization filter is designed to have a non-uniform response in the frequency passband as compared to the uniform response of a sinc or sinc-like function. To the extent that the low-pass rasterization function has a non-uniform response in its frequency passband, an equalizing filter 470 may be added to compensate for the non-uniform response. The M3D filter 490 is then a combination of the electromagnetic scattering and the equalization.

The approach described above may be repeated for Gap feature images with different spacings $\Delta$, for example in increments of 1 nm. It may also be repeated for different orientations and polarities. It may also be repeated for other 2-edge and more complex feature images.

Eqn. 1 may be calculated and solved in the spatial domain using direct convolutions. However, it may also be processed in the spatial frequency domain. The quantities are converted to the spatial frequency domain, and the convolution becomes a product. The equivalent equation is then $$FT\{MF\} = \Sum_{i=1}^{N} FT\{I_i\} FT\{K_i\} \qquad (2)$$

where FT{ } is the Fourier transform.

Figure 5:
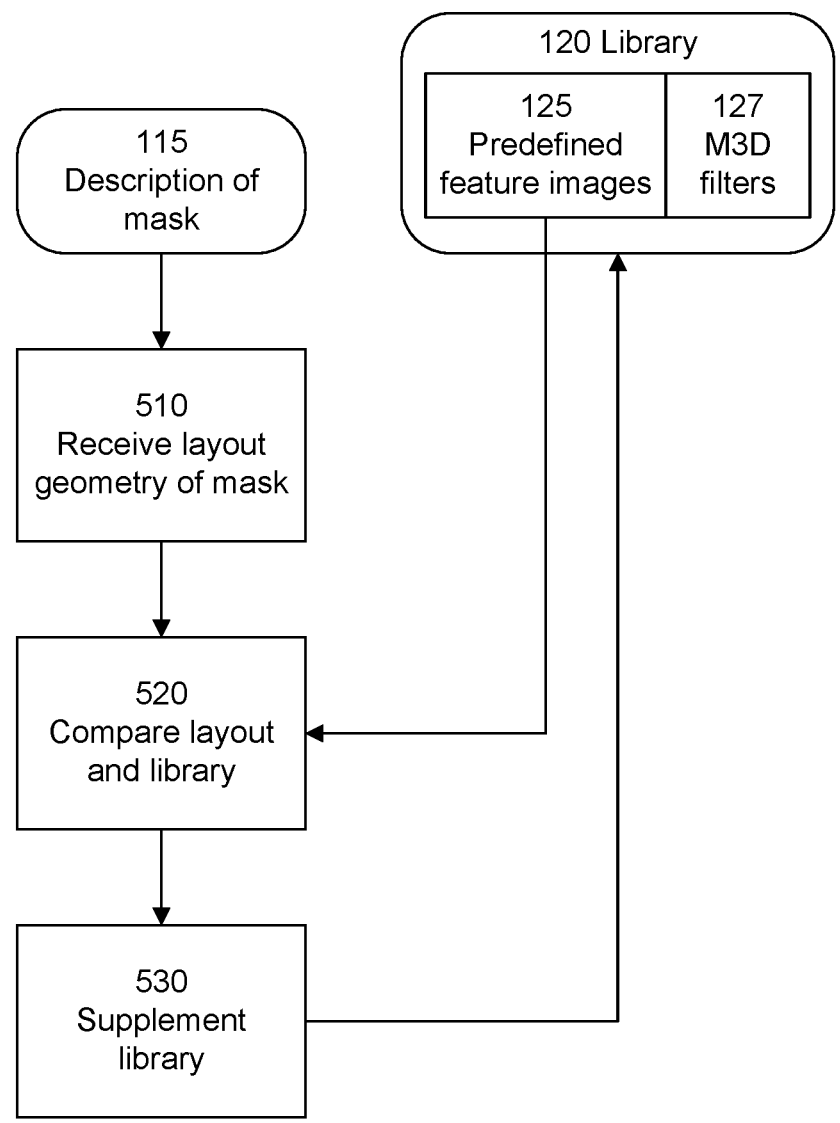
FIG. 5 is a flowchart for developing a library of feature images.

In some cases, the feature images included in the library depend on the layout geometry of the mask. FIG. 5 is a flowchart for developing a library of feature images. The library 120 may begin with a base set of common feature images, which are then supplemented based on which feature images are present in the layout geometry of the lithographic mask. In FIG. 5, the mask layout is received 510. The layout geometry is compared 520 to the feature images already in the library. If the library is inadequate, for example if certain features appear in the mask but without the corresponding feature images in the library, the library may be supplemented 530 with additional feature images. The M3D filters for these feature images may be calculated as described above.

In addition to making calculations in either the spatial domain (Eqn. 1 above) or the spatial frequency domain (Eqn. 2 above), calculations may also be performed either in parallel or sequentially. In a fully parallel approach, all feature images are convolved with the corresponding M3D filters in parallel. The results are then summed.

Various embodiments of the approach described herein may also have the following features and benefits. It can be implementation friendly for both machine learning (ML) and non-ML frameworks as well as for graphics processing units (GPU). As shown above, the model formation is based on convolutions between feature images and M3D filters, which is compatible with popular ML frameworks (e.g., TensorFlow) and GPUs. Therefore, it can be directly implemented in these frameworks to take advantage of the capabilities (e.g., optimization engine, hardware acceleration, etc.) offered by these ML frameworks for lithography applications (e.g., lithography model calibration/fine-tuning, mask layout optimization, illumination source optimization, etc.).

It can also be data efficient for model creation, training and calibration. A conventional ML-based M3D model relies on the machine to generate feature images and filters by learning from data, which is highly empirical and generally requires a massive amount of data in order to avoid overfitting and ensure prediction stability. It is computationally expensive and time consuming to generate the required amount of data. In the approach described here, the feature images and M3D filters are generated based on physical insight, which is more stable and requires significantly less data.

It can improve runtime. The feature images generation involves rasterizing mask polygons into greyscale images. Conventionally, the mask polygons are rasterized into thin-mask transmission functions, which is computationally inefficient as a sinc (or sinc-like) rasterization function must be used for thin-mask transmission function calculations in order to ensure a uniform frequency response in the passband. In the approach described herein, a special rasterization function may be designed which is more compact than the sinc (or sinc-like) function and therefore is computationally more efficient. This new rasterization function does not need to have a uniform frequency response in the passband. The M3D filters are modified (step 470 in FIG. 4A) to restore the required frequency response in the convolutions between the feature images and the modified M3D filters.

It can be computationally efficient for both Hopkins and Abbe imaging models. While only one MF is required in Hopkins imaging simulation, multiple MFs (one per incident field angle) are required in Abbe imaging simulation, which significantly increases the runtime as the MF is calculated multiple times if the conventional Abbe-based approach is used. In the approach described here, the feature images may be independent of the incident field angle and therefore only need to be computed once. Although multiple sets of M3D filters and convolutions (one per incident field angle) are used, the filters can be pre-computed and the convolutions can be done efficiently using FFT methods.

These increases in computational efficiency and runtime can make it feasible to simulate the entire mask layout of a chip in a reasonable amount of time.

Figure 6:
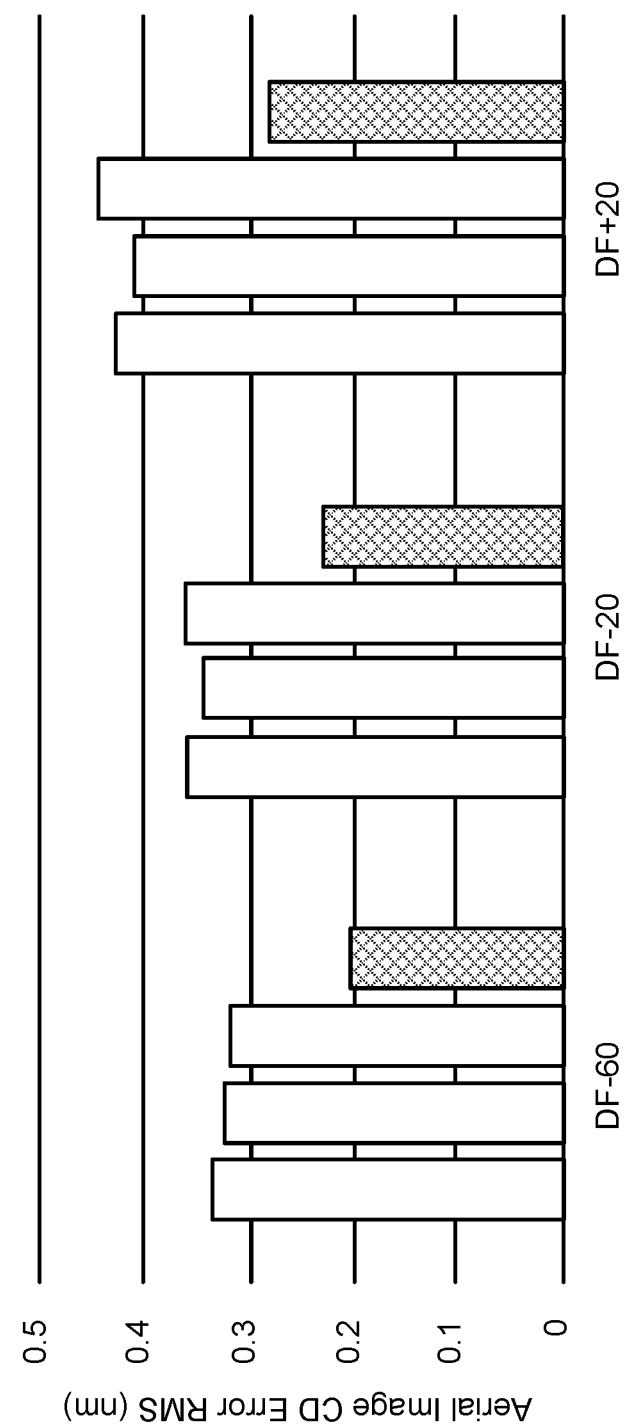
FIG. 6 illustrate results comparing the approach described herein to other approaches.

FIG. 6 illustrate results comparing the approach described above to other approaches. These experiments simulate an EUV mask with different types of patterns on the mask. FIG. 6 shows the root-mean-square of the CD (critical dimension) error in the aerial image predicted using this approach versus three other approaches. In FIG. 6, the cross-hatched bar is the approach described herein, and the white bars are the other approaches. The left group of four bars is at a defocus of −60 nm, the center group is at defocus of −20 nm, and the right group is at defocus of +20 nm. In all cases, the approach described herein has lower RMS error.

Figure 7:
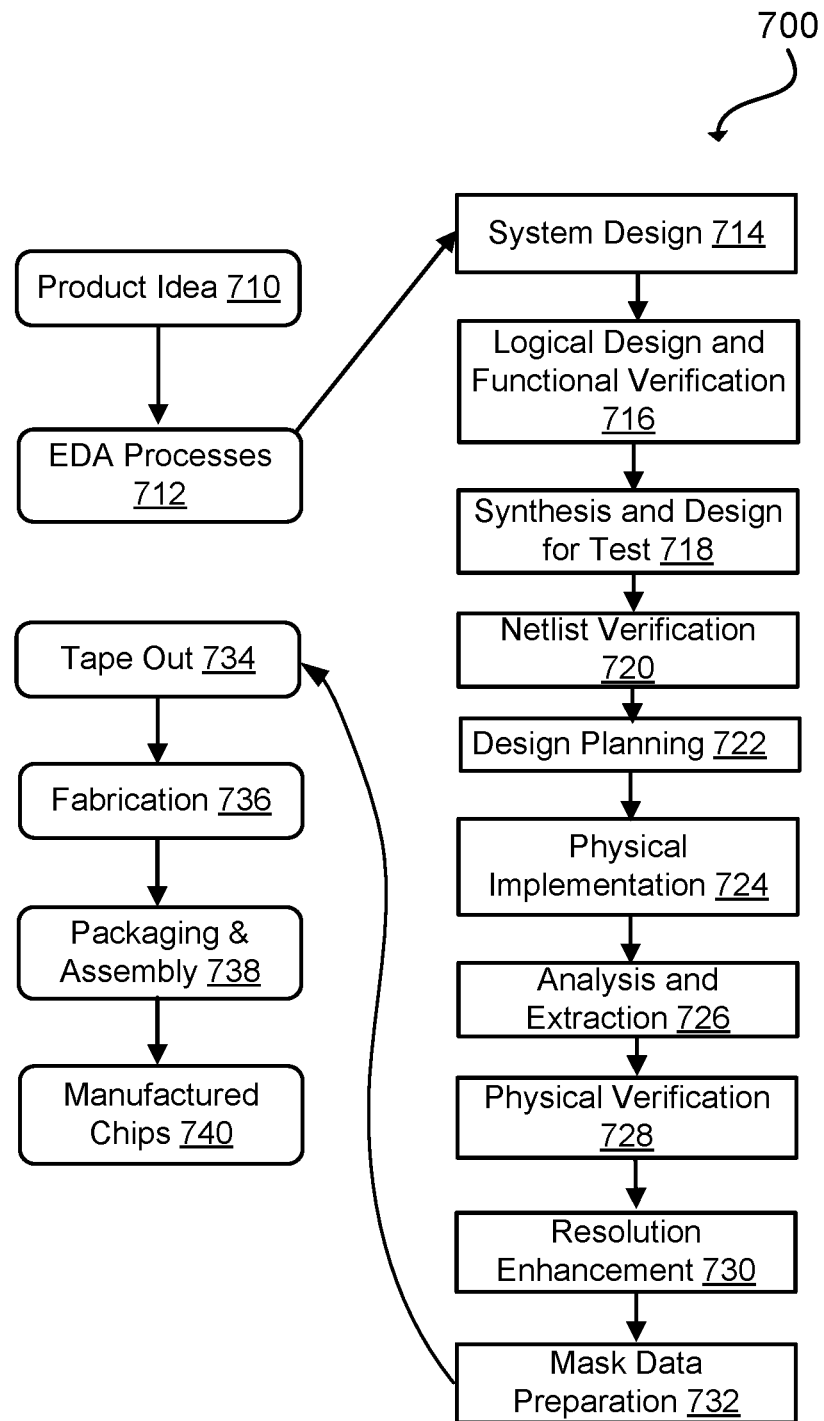
FIG. 7 is a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
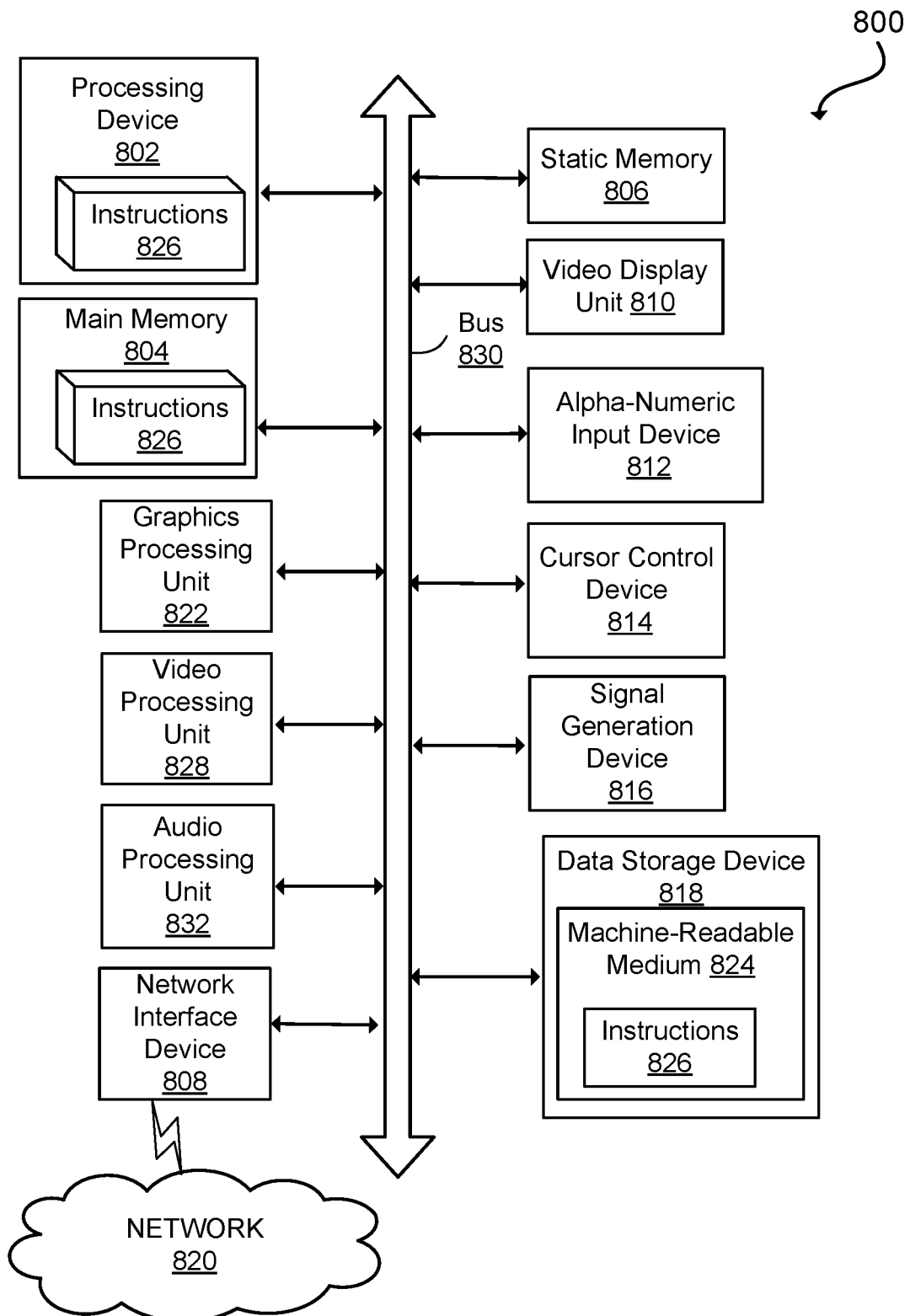
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
    receiving a layout geometry of a lithographic mask, wherein the layout geometry of the mask comprises a plurality of polygons;
    partitioning the layout geometry into a plurality of feature images, wherein the feature images are images that represent geometric features present in the layout geometry of the lithographic mask and partitioning the layout geometry into feature images comprises rasterizing the mask polygons using a low-pass rasterization function that has a non-uniform response in a frequency passband;
    calculating, by a processor, a mask function (MF) contribution from each of the plurality of feature images by convolving the feature image with a corresponding mask 3D (M3D) filter, wherein the M3D filter corresponding to a feature image represents an electromagnetic scattering effect of the geometric feature represented by that feature image and the M3D filters include effects of an equalization filter that compensate for the non-uniform response; and
    combining the calculated MF contributions to determine a mask function for the lithographic mask.

2. The method of claim 1 further comprising:
    determining the M3D filters by rigorous electromagnetic simulation of the scattering effects of mask structures based on the geometric features illuminated by a source illumination.

3. The method of claim 1 wherein the plurality of feature images are selected from a library that contains predefined feature images and their corresponding precalculated M3D filters.

4. The method of claim 3 wherein the library of predefined feature images comprises feature images of different order complexity, and the method further comprising:
    precalculating the M3D filters in an order according to their complexity.

5. The method of claim 4 wherein determining the M3D filter for a feature image of higher order complexity comprises:
    determining a mask structure corresponding to the higher-order feature image;
    partitioning the mask structure into the higher-order feature image and one or more lower-order feature images;
    executing a rigorous electromagnetic simulation to predict a mask function for the mask structure;
    calculating the MF contributions from each of the plurality of lower-order feature images by convolving the lower-order feature image with its corresponding M3D filter; and
    determining the M3D filter for the higher-order feature image, based on combining the MF contribution from the higher-order feature image with the MF contributions from the lower-order feature images to yield the predicted mask function for the mask structure corresponding to the higher-order feature image.

6. The method of claim 4 further comprising:
    determining the predefined feature images in the library, based on which geometric features are present in the layout geometry of the lithographic mask.

7. The method of claim 6 wherein the library of predefined feature images comprises a common base of feature images supplemented by higher-order feature images for geometric features present in the layout geometry of the lithographic mask.

8. The method of claim 1 wherein rasterizing the mask polygons produces grayscale feature images.

9. The method of claim 1 further comprising:
    applying the mask function as input to an Abbe imaging model or Hopkins imaging model.

10. A system comprising:
    a computer readable storage medium storing instructions and a library containing predefined feature images and corresponding precalculated mask 3D (M3D) filters, wherein the predefined feature images are images that represent geometric features present in layout geometries of lithographic masks; and a processor, coupled with the computer readable storage medium and to execute the instructions, the instructions when executed cause the processor to:
  partition a layout geometry of a lithographic mask into a plurality of feature images selected from the library; wherein the layout geometry of the mask comprises a plurality of polygons and partitioning the layout geometry into feature images comprises rasterizing the mask polygons using a low-pass rasterization function that has a non-uniform response in a frequency passband;
  calculate mask function (MF) contributions from each of the plurality of feature images by convolving the feature image with the corresponding M3D filter from the library, wherein the M3D filters include effects of an equalization filter that compensate for the non-uniform response; and
  combining the calculated MF contributions to determine a mask function for the lithographic mask.

11. The system of claim 10 wherein the library of predefined feature images comprises an area image, one or more single-edge images, and multiple multi-edge images.

12. The system of claim 11 wherein the library of predefined feature images comprises multiple feature images each consisting of two parallel edges.

13. The system of claim 11 wherein the library of predefined feature images comprises multiple feature images each consisting of two perpendicular edges that form a corner.

14. The system of claim 11 wherein the library of predefined feature images comprises multiple feature images each consisting of a single edge oriented at an angle that is not a multiple of 45 degrees.

15. The system of claim 11 wherein the library of predefined feature images comprises multiple feature images each consisting of a curvilinear edge.

16. A non-transitory computer readable medium comprising stored instructions, which when executed by a processor, cause the processor to:
  partition a layout geometry of a lithographic mask into a plurality of feature images, wherein the feature images are images that represent geometric features present in the layout geometry of the lithographic mask, the layout geometry of the mask comprises a plurality of polygons, and partitioning the layout geometry into feature images comprises rasterizing the mask polygons using a low-pass rasterization function that has a non-uniform response in a frequency passband;
  calculate a mask function (MF) contribution from each of the plurality of feature images using mask 3D (M3D) filters for the feature images, wherein the M3D filters include effects of an equalization filter that compensate for the non-uniform response; and
  combine the calculated MF contributions to determine a mask function for the lithographic mask.

17. The non-transitory computer readable medium of claim 16 wherein the M3D filters are based on rigorous electromagnetic simulation.

18. The non-transitory computer readable medium of claim 16 wherein the layout geometry comprises a layout geometry for an entire chip.

19. The non-transitory computer readable medium of claim 16 wherein a source illumination of the lithographic mask is an extreme ultraviolet (EUV) or deep ultraviolet (DUV) illumination.

* * * * *